United States Patent
Wabnegger et al.

(10) Patent No.: US 11,760,485 B2
(45) Date of Patent: *Sep. 19, 2023

(54) UNMANNED AERIAL VEHICLE FOR USE NEAR HIGH VOLTAGE POWER LINES

(71) Applicant: Quanta Associates, L.P., Houston, TX (US)

(72) Inventors: David Karl Wabnegger, Burnaby (CA); Daniel Neil O'Connell, Burnaby (CA)

(73) Assignee: Quanta Associates, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/750,910

(22) Filed: May 23, 2022

(65) Prior Publication Data

US 2022/0281600 A1    Sep. 8, 2022

Related U.S. Application Data

(63) Continuation of application No. 16/213,281, filed on Dec. 7, 2018, now Pat. No. 11,358,717.

(Continued)

(30) Foreign Application Priority Data

Dec. 8, 2017   (CA) ................................ CA 2988156

(51) Int. Cl.
*B64C 39/02*    (2023.01)
*G01R 31/08*    (2020.01)
(Continued)

(52) U.S. Cl.
CPC .......... *B64C 39/024* (2013.01); *G01R 31/085* (2013.01); *G05D 1/0022* (2013.01);
(Continued)

(58) Field of Classification Search
CPC ............ B64C 39/024; B64C 2201/027; B64C 2201/12; B64C 2201/123;
(Continued)

(56) References Cited

U.S. PATENT DOCUMENTS

| 4,795,111 A * | 1/1989 | Moller ..................... B64C 27/20 244/100 R |
| 9,393,683 B2 * | 7/2016 | Bevins, Jr. ................. B25F 5/00 |

(Continued)

FOREIGN PATENT DOCUMENTS

CA    2988156 A1 *   6/2019   ........... B64C 39/024

OTHER PUBLICATIONS

Felipe Esteban Serey Farias, Resolution for the notification of the expert report for Chilean Patent Application No. CL 01506-2020, dated Dec. 30, 2021, 13 pages, Chile National Institute of Industrial Property, Chile.

(Continued)

*Primary Examiner* — Benjamin P Lee
(74) *Attorney, Agent, or Firm* — Oathout Law Firm; Elizabeth Gray; Antony C. Edwards

(57) ABSTRACT

A remotely controlled unmanned aerial device for use in proximity or in contact with high voltage powerlines, includes an unmanned aerial vehicle and an electrically conductive shield forming part of or operatively coupled to so as to encapsulate the unmanned aerial vehicle. When in the presence of a high voltage powerline, the unmanned aerial vehicle either when bonded-on or within the corresponding magnetic fields of the powerline, so as to transfer the powerline potential in whole or in part to the unmanned aerial vehicle, electrically energizes the conductive shield around the unmanned aerial vehicle while leaving components of the unmanned aerial vehicle within the shield substantially electrically unaffected by the voltage potential.

12 Claims, 10 Drawing Sheets

Related U.S. Application Data

(60) Provisional application No. 62/596,674, filed on Dec. 8, 2017.

(51) Int. Cl.
| | |
|---|---|
| *G05D 1/00* | (2006.01) |
| *G05D 1/10* | (2006.01) |
| *H02G 1/02* | (2006.01) |
| *H05K 9/00* | (2006.01) |
| *B64U 10/13* | (2023.01) |
| *B64U 101/30* | (2023.01) |
| *G08C 17/02* | (2006.01) |

(52) U.S. Cl.
CPC .............. *G05D 1/101* (2013.01); *H02G 1/02* (2013.01); *H05K 9/0007* (2013.01); *B64U 10/13* (2023.01); *B64U 2101/30* (2023.01); *B64U 2201/20* (2023.01); *G08C 17/02* (2013.01)

(58) Field of Classification Search
CPC ........ B64C 2201/126; B64C 2201/127; G01R 31/085; G05D 1/101; H02G 1/02; H05K 9/0007

See application file for complete search history.

(56) References Cited

U.S. PATENT DOCUMENTS

| | | | | |
|---|---|---|---|---|
| 9,421,869 | B1* | 8/2016 | Ananthanarayanan | G05D 1/104 |
| 9,845,165 | B2* | 12/2017 | Michalski | G08G 5/0065 |
| 10,099,561 | B1* | 10/2018 | Ananthanarayanan | B60L 53/32 |
| 10,239,637 | B2* | 3/2019 | Ashdown | H04K 3/68 |
| 10,418,853 | B2* | 9/2019 | Yang | B64C 25/52 |
| 10,491,021 | B1* | 11/2019 | Syracuse | H02J 7/0068 |
| 10,498,169 | B1* | 12/2019 | Syracuse | B60L 53/14 |
| 10,822,080 | B2* | 11/2020 | Kirkbride | B60L 5/04 |
| 10,899,475 | B1* | 1/2021 | Freeman, Jr. | B64C 39/024 |
| 2015/0314434 | A1* | 11/2015 | Bevins, Jr. | H02G 1/02 408/124 |
| 2016/0364989 | A1* | 12/2016 | Speasl | B64U 80/84 |
| 2016/0376031 | A1* | 12/2016 | Michalski | G08G 5/0013 701/15 |
| 2017/0069214 | A1* | 3/2017 | Dupray | G05D 1/104 |
| 2018/0265098 | A1* | 9/2018 | Evans | B64D 1/22 |
| 2019/0077505 | A1* | 3/2019 | Akens | B64C 39/024 |
| 2019/0161204 | A1* | 5/2019 | Riedel | B64U 10/10 |
| 2019/0260191 | A1* | 8/2019 | Lavoie | B64C 39/024 |
| 2021/0253241 | A1* | 8/2021 | Haran | B64U 10/13 |

OTHER PUBLICATIONS

Low, Alan, Examination report No. 1 for Australian Patent Application No. 2018380299, dated Jul. 18, 2022, 4 pages, IP Australia, Australia.

Escobar, Mariellys, Substantive Examination for Panamanian Patent Application No. 93080-01, Oct. 18, 2022, 4 pages, Industrial Property Registry of the Ministry of Commerce and Industries, Panama.

Srivastava, A P, Examination Report for Indian Patent Application No. 202027022684, dated Nov. 29, 2022, 6 pages, Intellectual Property India, India.

Prudenciado Jr., Nony F., Substantive Examination Report for Philippines Patent Application No. 1/2020/550807, dated Jul. 12, 2022, 4 pages, Intellectual Property Office of the Philippines, Bureau of Patents, the Republic of the Philippines.

Felipe Esteban Serey Farias, Resolution for Chilean Patent Application No. CL 2020-001506, dated Jun. 24, 2022, 11 pages, National Institute of Industrial Property, Chile.

Rejection Resolution for Chilean Patent Application No. CL 2020-001506, dated Jan. 6, 2023, 5 pages, National Institute of Industrial Property, Chile.

* cited by examiner

UNMANNED AERIAL VEHICLE FOR USE NEAR HIGH VOLTAGE POWER LINES

CROSS-REFERENCE TO RELATED APPLICATIONS

This application is a continuation of and claims the benefit of U.S. patent application Ser. No. 16/213,281 filed Dec. 7, 2018; and U.S. patent application Ser. No. 16/213,281 claims the benefit of U.S. Provisional Patent Application No. 62/596,674 filed on Dec. 8, 2017 and claims priority from Canadian Patent Application No. 2,988,156 filed on Dec. 8, 2017, both entitled, "Unmanned Aerial Vehicle for Use Near High Voltage Power Lines". Entireties of all the applications identified in this section are incorporated herein by reference.

FIELD OF THE INVENTION

The present invention relates to unmanned aerial vehicles and in particular to means for protecting them for use near or for bond-on to high voltage power lines.

BACKGROUND

Maintenance and testing of powerlines is regularly required to ensure proper operation, repair damage and ensure safety. Such inspection and maintenance has commonly been done manually by linemen who are lifted up from the ground or climb the support structures to inspect lines, take images, conduct tests, perform repairs and maintenance. Commonly the linemen are raised in a bucket connected to a mobile boom system, such as that on a so called bucket truck, or the linemen physically have to climb the power line structure. These methods are time consuming and increase the safety hazards for the linemen.

In some cases helicopters have been used to lower linemen and their testing, imaging, repair or maintenance equipment down on to powerlines. While this may eliminate the need for a bucket truck or climbing the support structure, there are a number of disadvantages of using a helicopter. Manned helicopter usage is very expensive. From a safety standpoint, there can be risks in maneuvering the helicopter and any attached linemen or equipment near energized powerlines. Further, laws may restrict or ban the use of manned helicopters near powerlines.

To conduct work on high voltage conductors, it is typically not preferable to shut down or de-energize the conductors, since this is not cost efficient for the utility company and results in power outages. Hence, maintenance, repair and testing is often done without de-energizing conductors and other energized electrical components of the power line systems including but not limited to overhead static lines or sleeves, or substation bus pipe.

In the prior art, applicant is aware of U.S. Pat. No. 9,421,869 which issued to Amazon Technologies Inc. on Aug. 23, 2016, and which discloses a power UAV 110 on which smaller rechargeable UAVs 130 land. Faraday shielding 122 is used to cover the electrical components of the power UAV from magnetic fields. Further electrical shielding 128 is used to cover the rechargeable UAVs once they are landed. The power UAV in one embodiment recharges by getting close enough to energized conductors in order to inductively couple with the magnetic field of the conductors. The rechargeable UAVs recharge on the power UAV. According to the patent it is desirable to limit the size of the shielding because the shielding adds weight.

Applicant is also aware of U.S. Pat. No. 10,099,561 which issued to Amazon Technologies Inc. on Oct. 16, 2018, and which also discloses a power UAV and rechargeable UAVs which land on the power UAV. First shielding 122 is disclosed as a substrate which protects the power UAV electronics by weakening or blocking the magnetic fields emanating from the conductor. The shielding substrate is taught to be thicker over the more sensitive components so as to shield a stated example of 95% of the magnetic field. Protecting the UAVs from the effects of electrical bond-on to an energized conductor is not discussed in either of the Amazon patents, it not being taught in the patents to put any UAV into contact with the live conductor.

Applicant is also aware of U.S. Pat. No. 4,818,990 to Fernandes which discloses using a UAV to monitor a power line conductor using sensors and cameras while flying at a fixed distance from the conductor. The electronics in the UAV are disclosed as being protected by a metallic coated body 30. There is no discussion that the UAV may come into contact with, so as to electrically bond-on to, the energized conductor.

The terms "electrical component" or "electrical power line components" as used herein are intended to also include piece parts and devices including electrical components incorporating an electrically insulating or dielectric material such as an outdoor insulator. As used herein, reference to "powerlines" and "conductors" are interchangeable. For ease of reference, electrical conductors, static lines, optical ground wires (OPGWs) or substation bus are also interchangeably referred to herein as "power line cabling" or "power line cable" or "power line conductor."

A need therefore exists in the art for an unmanned aerial vehicle for conducting for example maintenance, testing, imaging, inspection, of energized powerlines, where the unmanned aerial vehicle may safely make contact with an energized conductor or energized electrical component.

SUMMARY

A remotely controlled UAV or unmanned aerial vehicle (collectively herein a UAV) is provided for use in close proximity or in contact with energized high voltage powerlines or associated energized electrical components. A suspension system may extend from the UAV to hold an attachment. A power source powers the UAV. The power source may be one or more power sources for powering both the UAV and its attachment. An electrically conductive shield is adapted to be operatively coupled to, and so as to encapsulate, the UAV, the suspension system, the attachment, and the power source or power sources. The UAV and its attachments and corresponding suspension and power supply are collectively referred to herein as the UAV system. The UAV system may include electronics, control including control processors, sensors including camera(s), a wireless radio frequency communicator, e.g. transceiver, electric motors, batteries, etc. The electrically conductive shield may be further adapted to be releasably coupled to cover a live-line tool as either the UAV's attachment or its suspension. When the shield is optimized and coupled to and encapsulates so as to form part of the UAV system, the resulting UAV system, if flown inadvertently or intentionally into contact with an energized conductor or energized electrical component and bond-on without harm.

In one aspect the present invention may be described as a UAV encapsulating bond-on covering that extends to the extent possible completely over the central system of the UAV (e.g. processor and electronics) and also over the appendages or attachments, leaving only the sensors (importantly for example the camera) uncovered where the sensor gathers data. The bond-on covering not only allows the matching of the line voltage potential as the UAV bonds-on, but protects the UAV from any voltage surge or small current surge as the voltage potential jumps from ground potential to, for example, 345 Kv within milliseconds. The bond-on covering also protects against unwanted bonding-on occurring between the energized conductor and for example a UAV suspension, appendage or attachment, instead leaving the location of the actual bond-on within the control of the lineman operating the UAV (for example using a UAV mounted bond-on wand). The protection afforded by a bond-on covering to a UAV operating in close proximity to an energized conductor protects the UAV against an inadvertent contact of the UAV with the energized conductor, or when the UAV is to be deliberately bonded-on to an energized conductor so as to provide advantageous industrial use of the UAV, its sensors and attachments in an energized high-voltage environment.

A further advantage because of the flexible suit material according to one embodiment, is that a single encapsulation of a UAV could include an attachment covering portion which may be opened and then re-closed to allow changing of the attachment without having to change the attachment conveying with custom attachments each having their own bond-on covering.

In a further aspect the present invention may be characterized as a UAV for use in close proximity or in contact with high-voltage powerlines, the bond-on protected UAV comprising:

a. an unprotected UAV unprotected from high voltage energized bond-on between an energized high voltage conductor and any part of the UAV, b. an electrically conductive bond-on covering encapsulating the unprotected UAV so that when any part of the UAV contacts the high voltage energized conductor or other energized powerline component associated with the energized conductor, a voltage potential of the energized conductor or powerline component is thereby transferred to the bond-on covering encapsulating the unprotected UAV while leaving components of the unprotected UAV within the bond-on covering substantially electrically unaffected by the voltage potential.

It is to be understood that other aspects of the present invention will become readily apparent to those skilled in the art from the following detailed description, wherein various embodiments of the invention are shown and described by way of illustration. As will be realized, the invention is capable for other and different embodiments and its several details are capable of modification in various other respects, all without departing from the spirit and scope of the present invention. Accordingly the drawings and detailed description are to be regarded as illustrative in nature and not as restrictive.

BRIEF DESCRIPTION OF THE DRAWINGS

A further, detailed, description of the invention, briefly described above, will follow by reference to the following drawings of specific embodiments of the invention. The drawings depict only typical embodiments of the invention and are therefore not to be considered limiting of its scope. In the drawings.

The drawings are not necessarily to scale and in some instances proportions may have been exaggerated in order more clearly to depict certain features.

DETAILED DESCRIPTION OF VARIOUS EMBODIMENTS

The description that follows and the embodiments described therein are provided by way of illustration of an example, or examples, of particular embodiments of the principles of various aspects of the present invention. These examples are provided for the purposes of explanation, and not of limitation, of those principles and of the invention in its various aspects.

Figure 1:
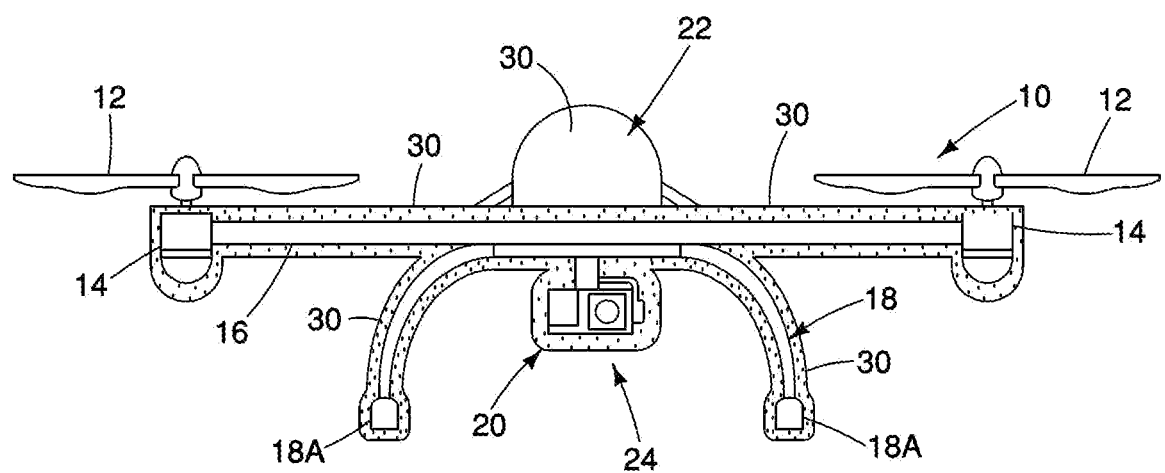
FIG. 1 shows, in a partially cut-away view, a UAV having an electrically conductive encapsulating bond-on covering according to one embodiment, wherein the bond-on covering is shown in cross section.

As seen in FIGS. 1, and 3-9, a UAV 10 includes, in conventional fashion propeller blades 12 driven by motors 14 mounted on a generally horizontally disposed frame 16. Landing gear 18 are fixed and rigidly disposed underneath frame 16. Conventionally, landing gear 18 includes rigid horizontal feet 18A that support UAV 10 when resting on the ground or other surfaces. A monitor such as a camera or sensor 20 may be mounted disposed centrally, for example underneath frame 16 as seen in FIG. 1 so as to be enclosed and protected by the rigid framework of landing gear 18. In the embodiment of FIGS. 4-9, the camera or sensor 20 is supported towards the front of the frame above the X-Ray non-destructive testing attachment. A control housing 22 may be mounted centrally on frame 16, for example, so as to extend upwardly therefrom.

An attachment 24, such as the X-Ray non-destructive testing attachment of FIGS. 4-9, may be either mounted to or suspended from UAV 10. The attachment may be battery powered, either by its own dedicated battery, or the attachment may be powered by the same battery power supply as used for the propeller motors 14 so that a single power source can be used for the propellers and the attachment. Motors 14 may also be fuelled engines or a single fuelled engine as in the case with UAV helicopters.

In some embodiments of the present invention it may be required to locate the UAV 10 into an energized zone closely adjacent a high voltage (e.g. greater than 65 kv) energized powerline 26, and in some applications it may be necessary that UAV 10 contacts or otherwise electrically "bonds on" the energized powerline 26 or energized powerline components, such as sleeves 28, associated with the powerline, so as to energize the UAV to powerline voltage.

Accordingly, in one embodiment, in order to protect the UAV 10 and UAV deployed attachments from inadvertent contact with, or during deliberate bond-on to the energized powerline, the UAV 10 and any attachments, for example various sensors for inspection and testing of the powerline or its components, is or are encapsulated in the sense of being encased or shrouded within, an electrically conductive covering 30. Covering 30 is adapted to provide an optimized Faraday cage around UAV 10 and its attachments. As one skilled in the art will understand, a Faraday cage operates so that no externally originating electrical charge will flow through the contents of the Faraday shield or cage and that, instead, the electrical charge originating from the external source such as the voltage potential from bonding-on, will be confined to, and flow around the Faraday cage. Therefore, when the Faraday cage is optimized to protect against high voltage surge upon bond-on, and encapsulates the UAV and its attachments, the UAV and its components will be electrically protected during a bond-on event whether intentional or not.

In one embodiment, not intended to be limiting, the optimized Faraday cage for protecting UAV 10 during bond-on may be made of the same material as used for making so-called lineman barehand suits. As one skilled in the art will understand, barehand suits are typically worn by linemen while conducting bare-hand live-line work on energized transmission lines. Covering 30 may thus be made from a material which includes a blend of fire retardant components and electrically conductive, metallic components. Thus, covering 30 may be made of strands of electrically non-conductive or dielectric, fire retardant fabric that is capable of being woven with electrically conductive metallic strands such as of steel, including those of stainless steel. For example, the covering 30 may be formed from a flexible material including 75% NOMEX® and KEVLAR® aramid fibres (collectively the fire retardant component) interwoven with 25% stainless-steel fibres or strands (the metallic component) so as to form an electrically conductive, preferably flexible, woven fabric matrix.

An example of a barehand suit material is the product manufactured and sold by Alsico USA under the trademark Euclid Vidaro's KV-Gard®. The KV-Guard product includes 75% NOMEX®, and 25% stainless-steel threads.

Figure 2:
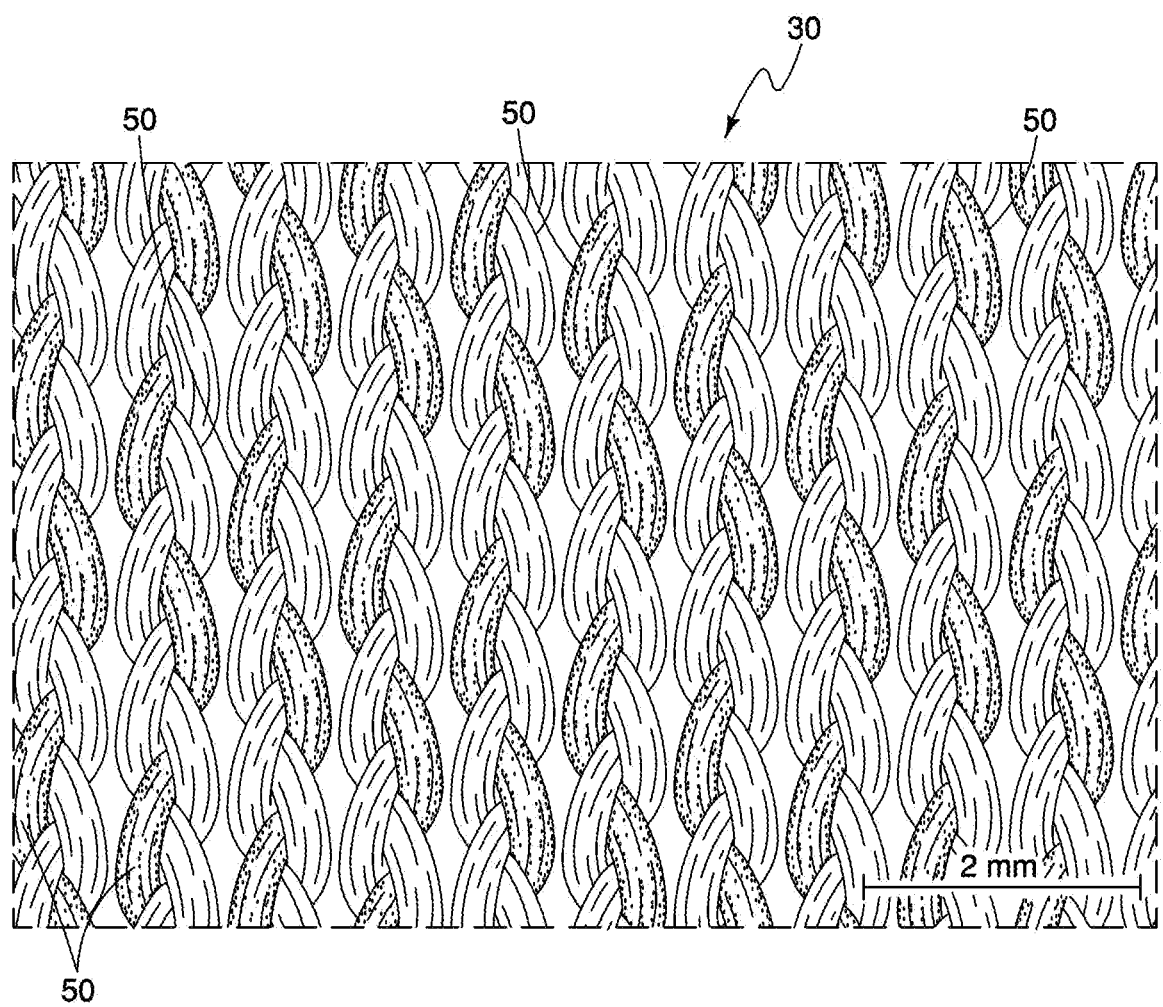
FIG. 2 is an enlarged portion of the material of the electrically conductive bond-on covering of FIG. 1.
Figure 3:
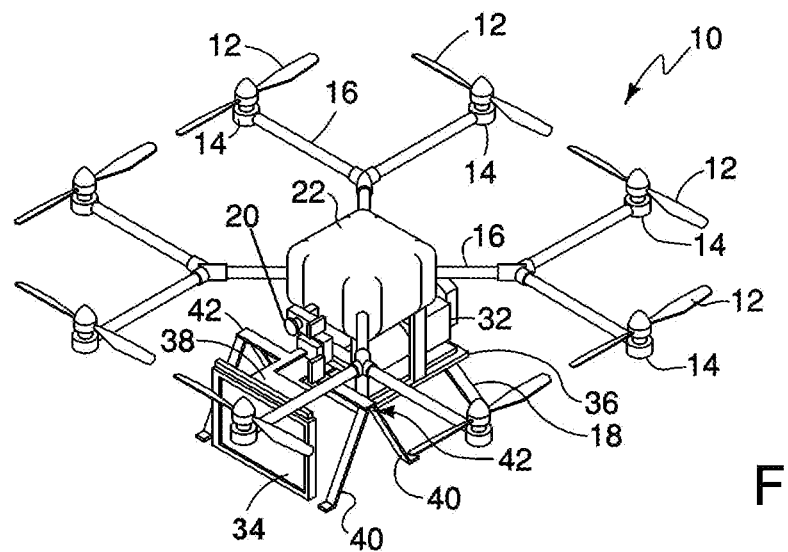
FIG. 3 shows, in front perspective view a further embodiment of a UAV carrying an X-Ray non-destructive testing attachment, with the bond-on covering removed.
Figure 4:
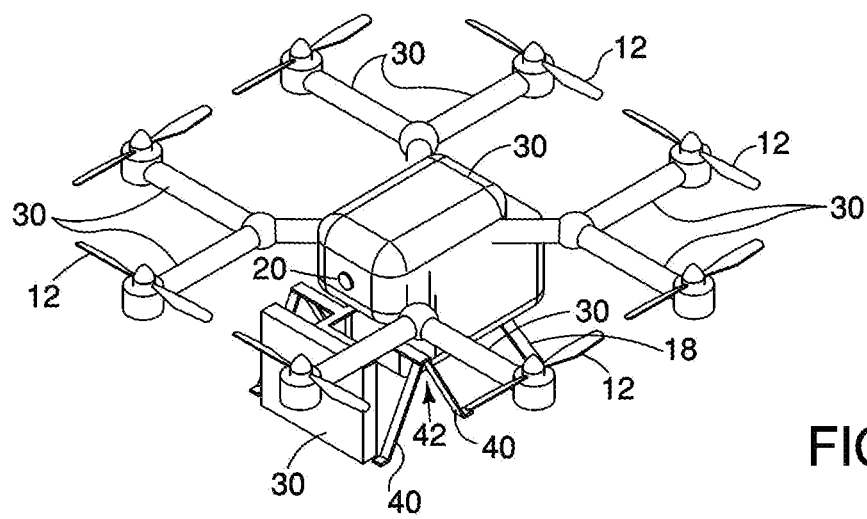
FIG. 4 is the view of FIG. 3 showing a bond-on covering on the UAV and attachment.
Figure 5:
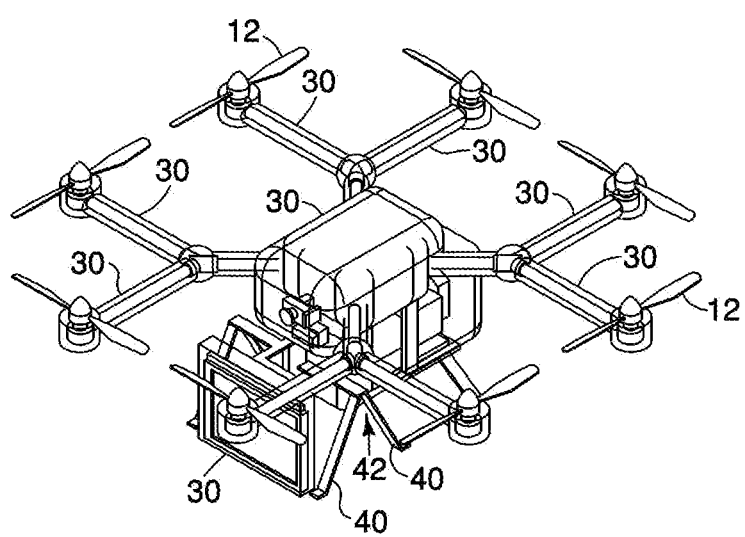
FIG. 5 is the view of FIG. 4 with the UAV shown in dotted outline within the bond-on covering.
Figure 6:
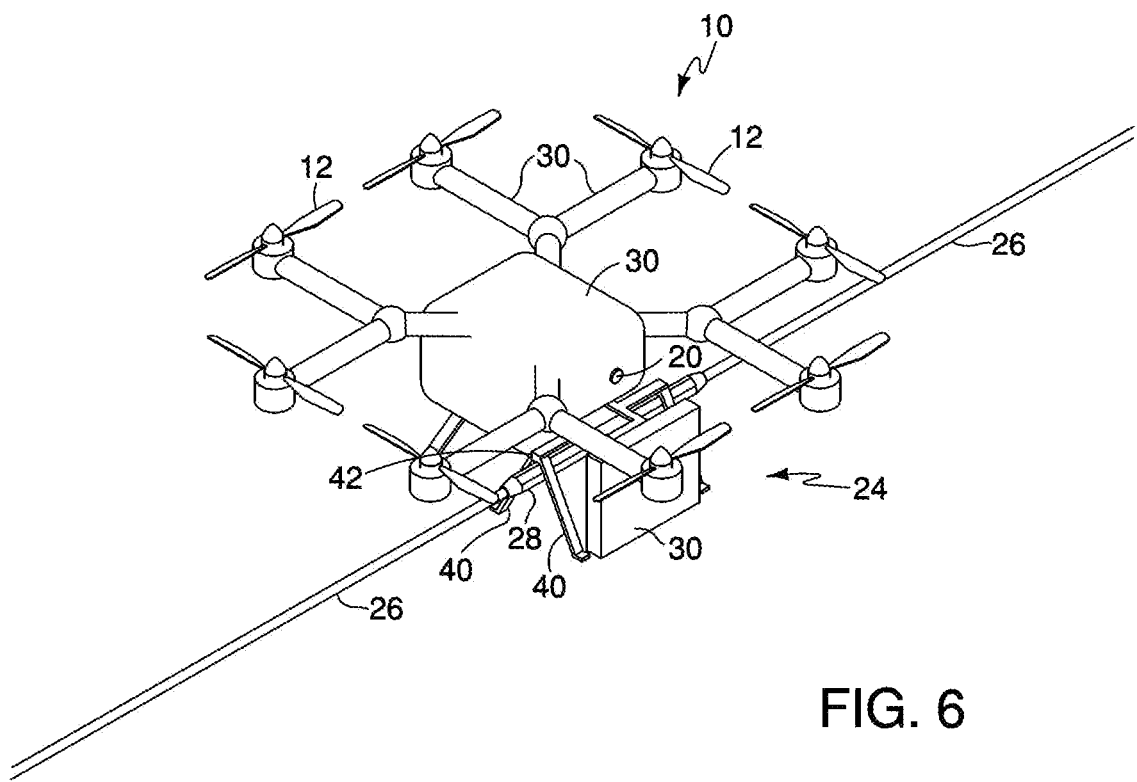
FIG. 6 is the embodiment of FIG. 4 showing the attachment engaged on to a sleeve on an energized conductor.
Figure 7:
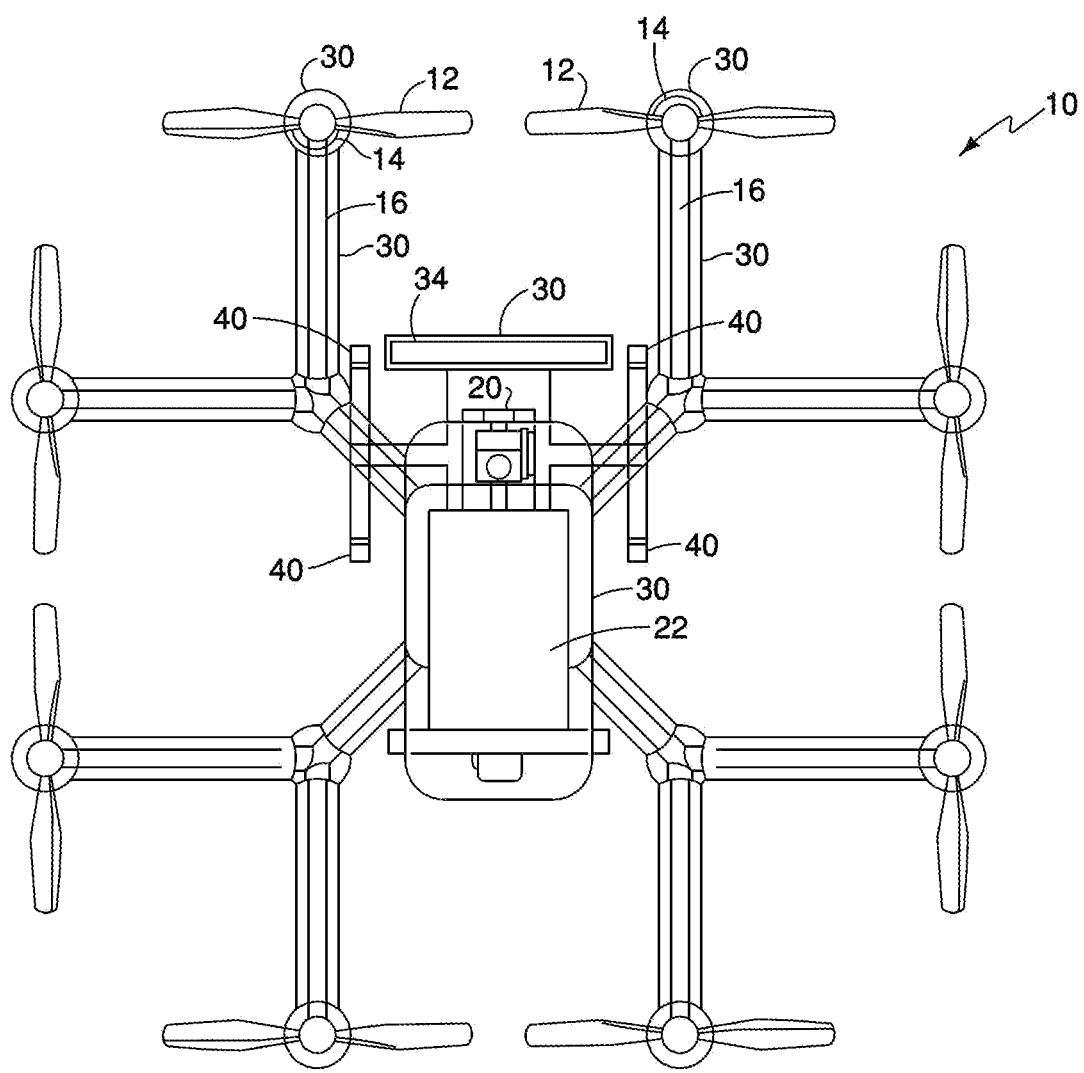
FIG. 7 is the embodiment of FIG. 5 in plan view.
Figure 8:
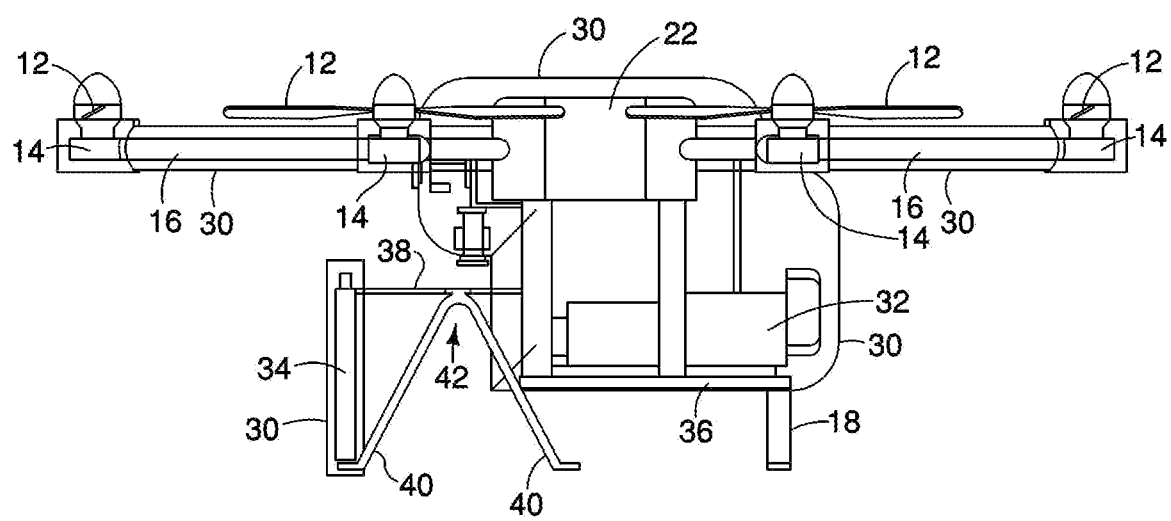
FIG. 8 is the embodiment of FIG. 5, in right side elevation view.
Figure 9:
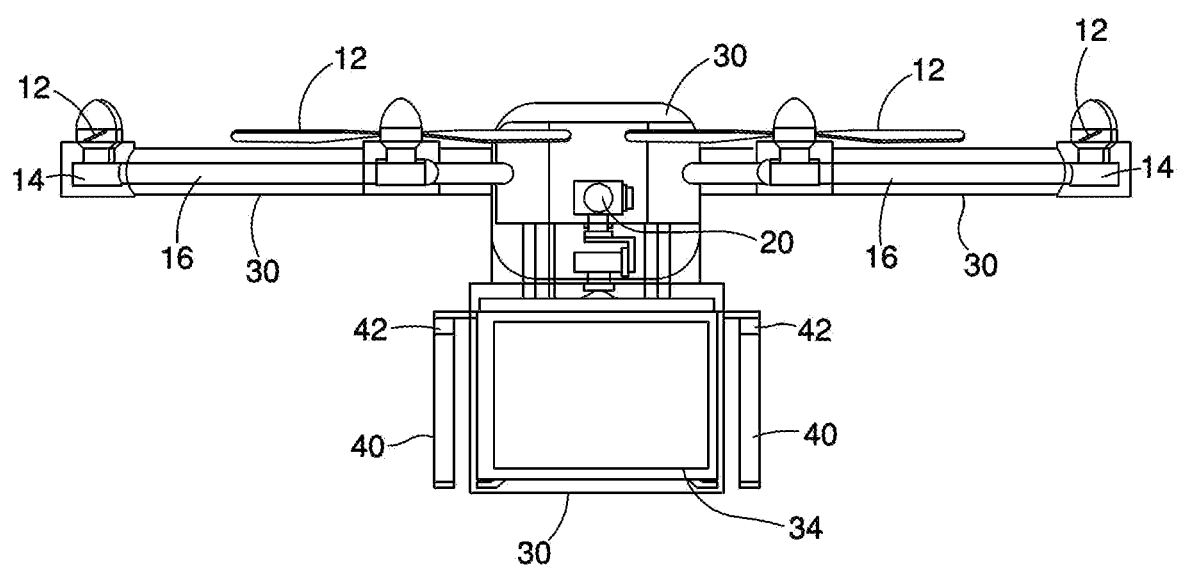
FIG. 9 is the embodiment of FIG. 5, in front elevation view.

Applicant has discovered that the barehand suit material, which for example may be described as non-electrically conductive threads and metallic threads 50 woven in a grid pattern such as the illustrated herringbone pattern in FIG. 2 (In FIG. 2, the relative size of the repeating weave pattern is approximately 15 mm to 20 mm in a vertical direction and is shown with approximately fifteen times magnification. The weave pattern in FIG. 2 is approximately 10 mm in a horizontal direction). The shroud using the barehand suit material effectively formed an optimized Faraday cage around UAV 10 in the energized environment described herein while allowing sensor and communication radiation, for example in the X-ray and Wi-Fi frequencies respectively to pass through covering 30.

In FIG. 2, each herringbone in the weave pattern is an interwoven blend of non-electrically conductive threads (e.g. fire retardant threads) and electrically conductive threads 50. Conductive threads 50 may be metal threads such as made from stainless steel or silver.

Thus, in one embodiment, the covering 30 is a removable, electrically conductive, flexible shroud formed from a herringbone weave of conductive and non-electrically conductive threads. Covering 30 may be formed as a customized or specialized form-fitted cover which is cut to a geometric form or shape corresponding to a geometric form or shape of the base 12 when the base is fitted with the components of UAV 10 so as to substantially fully, or fully encapsulate the UAV system. It will be appreciated that the accompanying drawings only illustrate one representative shape of the flexible covering 30. This is not intended to be limiting.

Covering 30 is intended to function as a specialized and optimized Faraday cage and thus is adapted to be operatively coupled so as to be electrically conductively coupled to the components of the UAV 10 and any attachments collectively forming a UAV system. Accordingly, one or more fastening elements (not shown) may be provided on an inside surface of covering 30 for operatively coupling covering 30 to its encapsulated UAV 10 and attachments 24.

As a person skilled in the art will appreciate, the construction and materials of covering 30 is not intended to be limited to the embodiments described above, and may be constructed of other electrically conductive materials using other construction techniques so as to create an effective optimized Faraday cage encapsulating the UAV system, and are intended to be included within the scope of the present disclosure.

Figure 10:
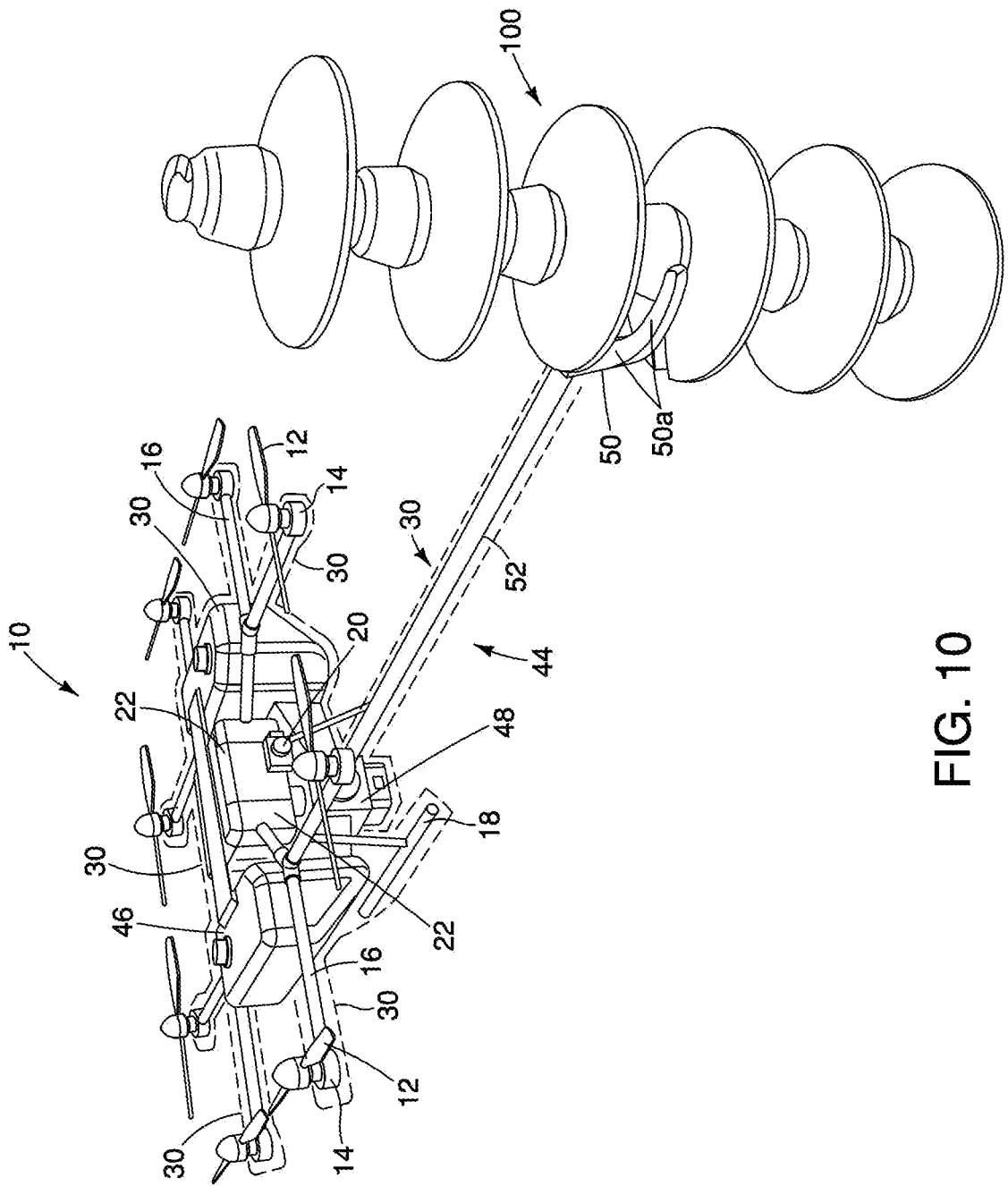
FIG. 10 is, in front perspective view, the UAV of FIG. 4 showing the bond-on covering in dotted outline and carrying an insulator cleaning attachment.
Figure 11:
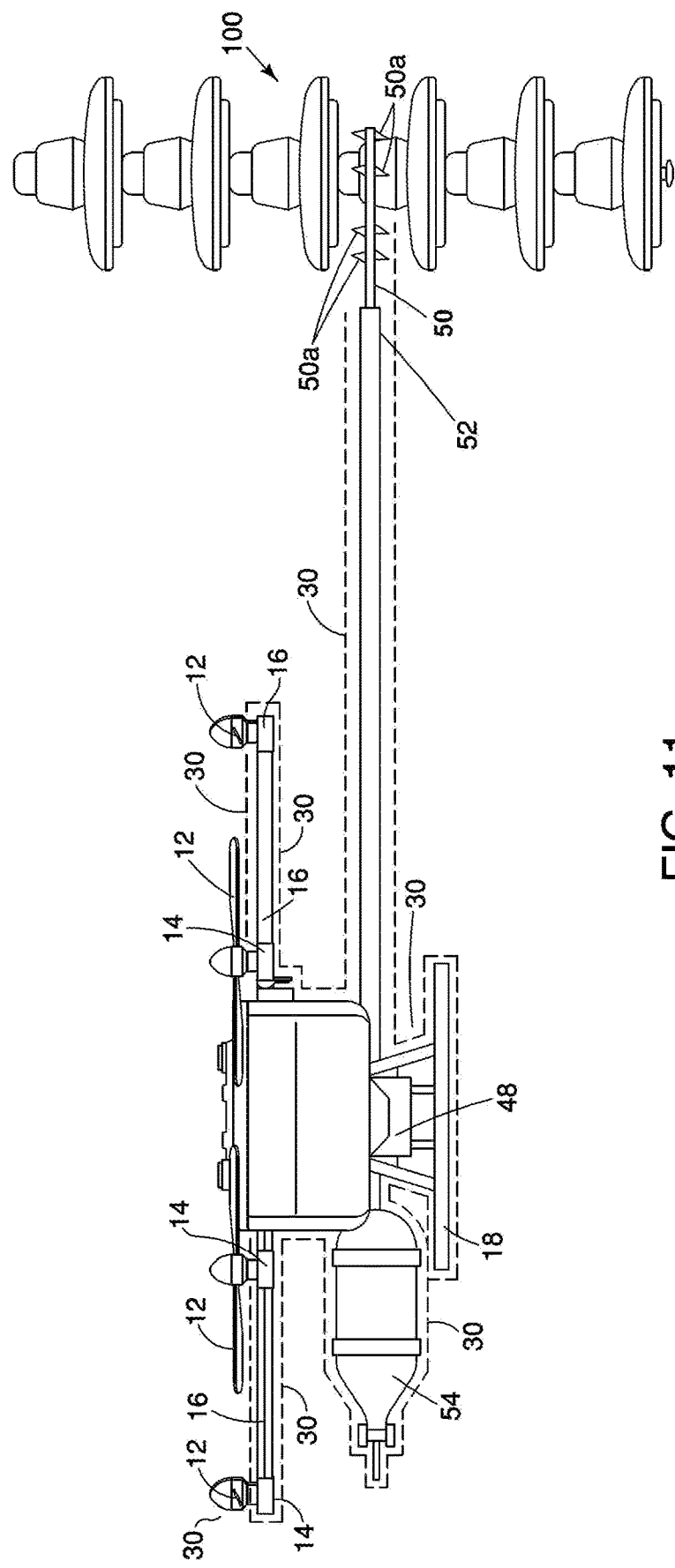
FIG. 11 is the embodiment of FIG. 10 in side elevation view.

In the embodiment of FIGS. 3-9, without intending to be limiting, attachment 24 is, as described above, an X-Ray non-destructive testing attachment. The X-Ray non-destructive testing attachment may as illustrated include an X-Ray source 32 and digital X-Ray sensor 34 such as for example divided by Vidisco Ltd. located in OR Yehuda, Israel. The X-Ray system is supported on a frame which includes a base 36 on which is mounted source 32 and a supporting arm 38 on which is mounted sensor 34. Legs 40 depend downwardly from base 36. The legs 40 adjacent sensor 34 form a generally vertically disposed downwardly opening pair of triangles each having a corresponding vertex 42. In use, the UAV flies over powerline 26 and lowers down so as to seat powerline 26 up into vertices 42 in the parallel pair of triangles formed of legs 40. In this fashion, powerline 26, or for example sleeve 28 is operatively positioned for scanning by the X-Ray source 32 and sensor 34; source 32 and sensor 34 being properly positioned on opposite sides of powerline 26. In the embodiment of FIGS. 10 and 11, an insulator cleaning attachment 44 is mounted under UAV 10 for cleaning insulator 100. Attachment 44 includes washer fluid tanks 46, pump 48 supplying spray cleaning head 50 having spray nozzles 50a, via insulated fiberglass tube 52. Pressurized gas canister 54 assists in pressurizing the washing fluid supplying head 50.

Figure 12:
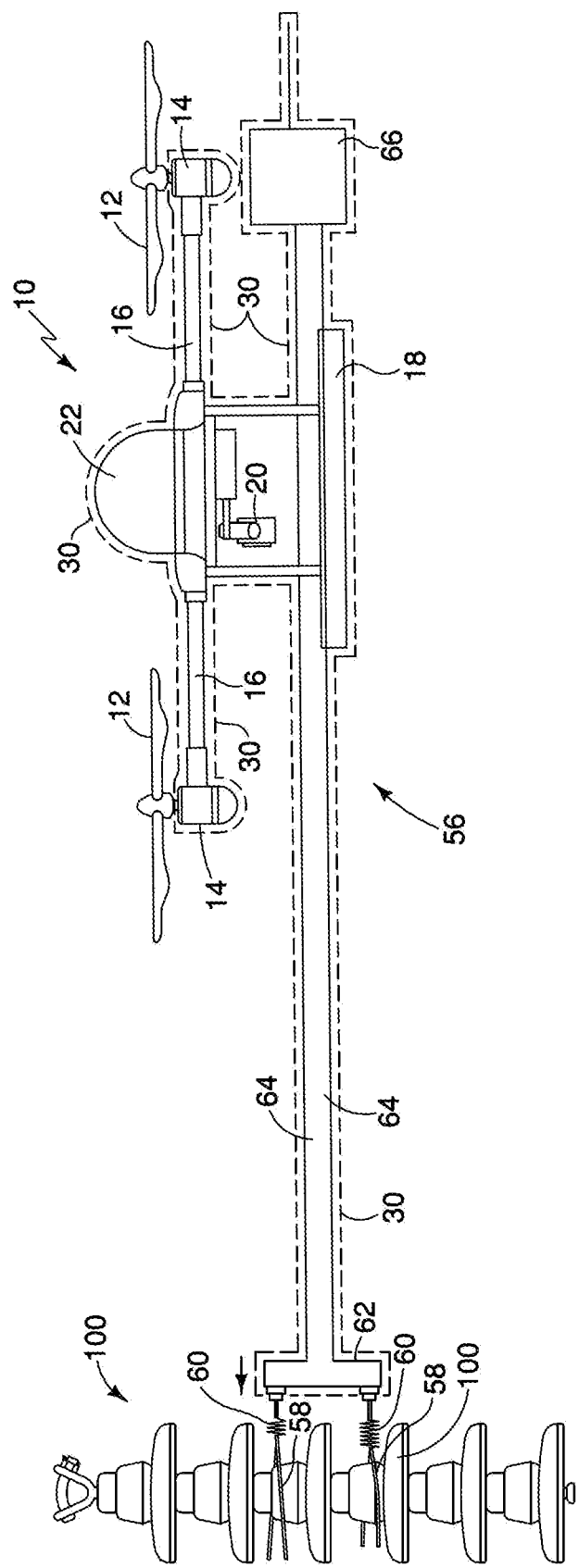
FIG. 12 is in side elevation view the UAV of FIG. 1 showing the bond-on covering in dotted outline and carrying an electrical resistance testing probe attachment.

In the embodiment of FIG. 12, an attachment is mounted on the end of a live-line tool; and in particular, insulator resistance testing attachment 56 is mounted under UAV 10 for electrically testing the resistance of insulators 100. Attachment 56 includes electrical contact probes 58 mounted on resilient suspension 60 to head 62 of insulated pole 64. The associated electronics for the electrical tester are located in housing 66 so as to counter balance pole 64 and head 62 under UAV 10.

The previous description of the disclosed embodiments is provided to enable any person skilled in the art to make or use the present invention. Various modifications to those embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the elements of the claims. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

What is claimed is:

1. A remotely controlled aerial system for electrically bonding-on to energized high voltage powerlines without harm, said system including at least an unmanned aerial vehicle and an attachment deployed on the unmanned aerial vehicle and comprising:
   a removable, electrically conductive, flexible covering having a geometric form corresponding to a geometric form of the unmanned vehicle and the attachment to encapsulate both the unmanned aerial vehicle and the attachment within the covering and adapted to be operatively coupled to both the unmanned aerial vehicle and the attachment to form a Faraday cage around both the unmanned aerial vehicle and the attachment for protecting the unmanned aerial vehicle and the attachment from electrical charge originating during the bonding-on by allowing the electrical charge to flow around the Faraday cage while leaving the unmanned aerial vehicle and the attachment within the covering substantially electrically unaffected by the electrical charge.

2. The system of claim 1, wherein the geometric form of the covering further corresponds to a geometric form of a suspension on which the attachment is held on, and wherein, the covering further encapsulates the suspension.

3. The system of claim 1, wherein the covering is made from a material chosen from the group comprising: embedded metallic fibres or strands, electrically conductive fabric, embedded carbon fibre.

4. The system of claim 1, wherein the covering is made from a material comprising a blend of fire retardant components and electrically conductive, metallic components.

5. The system of claim 4, wherein the material includes 75% of the fire retardant components and 25% of the electrically conductive, metallic components.

6. The system of claim 4, wherein the fire retardant components are aramid fibres and the electrically conductive, metallic components are stainless-steel fibres.

7. The system of claim 1, wherein the covering is made from a material which allows sensor and communication radiation to pass through the covering while maintaining the Faraday cage around both the unmanned aerial vehicle and the attachment.

8. The system of claim 7, wherein the material is barehand suit material comprising non-electrically conductive threads and metallic threads woven in a grid pattern.

9. The system of claim 1, wherein the covering further comprises one or more fastening elements for operatively coupling the covering to the unmanned aerial vehicle and the attachment.

10. A method for enabling a remotely controlled aerial system to electrically bond-on to energized high voltage powerlines without harm, the aerial system including at least an unmanned aerial vehicle and an attachment deployed on the unmanned aerial vehicle, the method comprising:
   a. providing the covering of claim 1;
   b. encapsulating both the unmanned aerial vehicle and the attachment within the covering and operatively coupling the covering to the unmanned aerial vehicle and the attachment for forming the Faraday cage around both the unmanned aerial vehicle and the attachment;
   b. flying the encapsulated unmanned aerial vehicle and the attachment over the powerlines and bonding-on to the powerlines; and
   c. allowing the electrical charge generated during the bonding-on to flow around the Faraday cage while leaving the unmanned aerial vehicle and the attachment within the covering substantially electrically unaffected by the electrical charge.

11. The method of claim 10 further comprising allowing sensor and communication radiation to pass through the covering while maintaining the Faraday cage around both the unmanned aerial vehicle and the attachment.

12. The method of claim 10, wherein the step of operatively coupling comprises fastening the covering to the unmanned aerial vehicle and the attachment.

* * * * *